(12) United States Patent
Kong et al.

(10) Patent No.: US 9,043,677 B2
(45) Date of Patent: *May 26, 2015

(54) MEMORY CONTROLLER AND OPERATING METHOD OF MEMORY CONTROLLER

(71) Applicant: SAMSUNG ELECTRONICS CO., LTD., Suwon-si, Gyeonggi-do (KR)

(72) Inventors: JaePhil Kong, Seoul (KR); Yongwon Cho, Seoul (KR); Jong-Uk Song, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/194,993

(22) Filed: Mar. 3, 2014

(65) Prior Publication Data

US 2014/0181589 A1 Jun. 26, 2014

Related U.S. Application Data

(63) Continuation of application No. 13/466,235, filed on May 8, 2012, now Pat. No. 8,667,369.

(30) Foreign Application Priority Data

May 9, 2011 (KR) ........................ 10-2011-0043621

(51) Int. Cl.
| | |
|---|---|
| *G06F 11/00* | (2006.01) |
| *G11C 29/00* | (2006.01) |
| *G06F 11/07* | (2006.01) |
| *H03M 13/15* | (2006.01) |
| *H03M 13/37* | (2006.01) |
| *H03M 13/00* | (2006.01) |
| *G06F 11/10* | (2006.01) |

(52) U.S. Cl.
CPC .......... *G06F 11/076* (2013.01); *H03M 13/152* (2013.01); *H03M 13/1545* (2013.01); *H03M 13/1555* (2013.01); *H03M 13/3715* (2013.01); *H03M 13/6502* (2013.01); *G06F 11/1048* (2013.01)

(58) Field of Classification Search
CPC .......... H03M 13/152; H03M 13/1545; H03M 13/3715; H03M 13/6502; H03M 13/1555; G06F 11/1048
See application file for complete search history.

(56) References Cited

U.S. PATENT DOCUMENTS

| | | | |
|---|---|---|---|
| 6,263,470 | B1 | 7/2001 | Hung et al. |
| 7,206,992 | B2 | 4/2007 | Xin |

(Continued)

FOREIGN PATENT DOCUMENTS

| | | |
|---|---|---|
| JP | 06-152436 | 5/1994 |
| JP | 2007-274239 | 10/2007 |

(Continued)

OTHER PUBLICATIONS

Yuejian Wu, "Low Power Decoding of BCH Codes", Circuits and Systems 2004, ISCAS '04, IEEE, pp. 369-372, vol. 2.

*Primary Examiner* — Guerrier Merant
(74) *Attorney, Agent, or Firm* — F.Chau & Associates, LLC

(57) ABSTRACT

A method of operating a memory controller to control a memory device includes reading a read vector from the memory device and correcting one or more errors in the read vector, where a power consumed at the correcting is varied according to the number of errors in the read vector.

21 Claims, 16 Drawing Sheets

(56) References Cited

U.S. PATENT DOCUMENTS

| | | |
|---|---|---|
| 7,237,183 B2 | 6/2007 | Xin |
| 7,590,924 B2 | 9/2009 | Au et al. |
| 8,667,369 B2 * | 3/2014 | Kong et al. .................. 714/763 |
| 8,832,528 B2 * | 9/2014 | Thatcher et al. ............. 714/766 |
| 2004/0177312 A1 | 9/2004 | Xin |
| 2004/0181735 A1 | 9/2004 | Xin |
| 2008/0288814 A1 * | 11/2008 | Kitahara ......................... 714/5 |
| 2009/0164704 A1 * | 6/2009 | Kanade et al. ................ 711/103 |
| 2010/0011247 A1 | 1/2010 | Shrader et al. |
| 2010/0131831 A1 | 5/2010 | Weingarten et al. |
| 2010/0241932 A1 * | 9/2010 | Sakaue et al. ................ 714/784 |
| 2011/0154160 A1 * | 6/2011 | Yurzola et al. ................ 714/763 |
| 2011/0197110 A1 | 8/2011 | Kanno et al. |
| 2012/0137152 A1 | 5/2012 | Dror et al. |
| 2012/0215962 A1 * | 8/2012 | Uhlaender .................... 711/103 |
| 2012/0233521 A1 | 9/2012 | Kwok et al. |
| 2012/0246526 A1 | 9/2012 | Dror |

FOREIGN PATENT DOCUMENTS

| | | |
|---|---|---|
| KR | 100214485 | 5/1999 |
| KR | 100251447 | 4/2000 |
| KR | 1020000067136 | 11/2000 |
| KR | 1020090021743 | 3/2009 |
| KR | 1020090092628 | 9/2009 |

* cited by examiner

MEMORY CONTROLLER AND OPERATING METHOD OF MEMORY CONTROLLER

CROSS-REFERENCE TO RELATED APPLICATIONS

This application is a continuation application of co-pending U.S. application Ser. No. 13/466,235 filed May 8, 2012, which claims priority under 35 U.S.C §119, to Korean Patent Application No. 10-2011-0043621 filed May 9, 2011, the disclosures of which are each incorporated by reference herein in their entireties.

1. TECHNICAL FIELD

Exemplary embodiments of the inventive concept relate to a memory controller and an operating method thereof.

2. DISCUSSION OF RELATED ART

A semiconductor memory device may be a memory device fabricated using semiconductors such as silicon (Si), germanium (Ge), gallium arsenide (GaAs), indium phosphide (InP), etc. Semiconductor memory devices may be classified into volatile memory devices and nonvolatile memory devices.

A volatile memory device requires power to maintain stored information and thus may lose its stored contents at power-off. Examples of volatile memory devices include a static RAM (SRAM), a dynamic RAM (DRAM), a synchronous DRAM (SDRAM), etc. A nonvolatile memory device may retain its stored contents even at power-off. Examples of nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc. A flash memory device can be a NOR type or a NAND type.

An increase in a storage capacity of a semiconductor memory device may be accomplished by improving the integrity of the semiconductor memory device and by programming multi-bit data into at least one memory cell. Improvement of the integrity of the semiconductor memory device may be accomplished by process refinement. A memory cell storing multi-bit data may be referred to as a multi-level cell (MLC).

However, the improved integrity and the introduction of MLC may cause an increase in an error rate. For example, as the integrity is improved, data stored in a memory cell may be more easily affected by noise. A memory controller that controls MLCs may need to include additional error correcting logic due to the increased error rate. However, use of the error correcting logic cause an increase in power consumption.

SUMMARY

According to an exemplary embodiment of the inventive concept, a method of operating a memory controller to control a memory device includes reading a read vector from the memory device and correcting one or more errors in the read vector, where a power consumed by the correcting is varied according to the number of errors in the read vector.

The power consumption may increase when the number of errors in the read vector is over a threshold value.

The read vector may include a data portion and a parity portion. An error search on the parity portion of the read vector may be skipped when the number of errors in the read vector is below a threshold value.

The correcting of the one or more errors in the read vector may include calculating a syndrome code from the read vector, calculating an error location polynomial from the syndrome code, measuring the number of errors in the read vector based on the error location polynomial, adjusting power consumption according to the measured error number, searching one or more errors in the read vector based on the adjusted power consumption, and correcting the searched one or more errors.

The measuring the number of errors in the read vector may include discriminating the number of errors in the read vector based on an index of the highest degree of the error location polynomial.

The adjusting of the power consumption may include adjusting the number of bits to be searched of the read vector.

The adjusting of the power consumption may include selecting a normal chien search when the measured error number is over a threshold value and selecting a parity-skipped chien search when the measured error number is below a threshold value.

Searching one or more errors in the read vector based on the adjusted power consumption and correcting the searched one or more errors may include conducting a forward chien search on data and parity portions of the read vector when the normal chien search is selected.

Searching one or more errors in the read vector based on the adjusted power consumption and correcting the searched one or more errors may include conducting a forward chien search only on a data portion of the read vector when the parity-skipped chien search is selected.

According to an exemplary embodiment of the invention concept, a method of operating a memory controller to control a memory device includes reading a read vector from the memory device, estimating a number of errors from the read vector, performing an error search on one of i) part of the read vector and (ii) the entire read vector based on the estimated number to determine actual errors in the read vector, and correcting the determined actual errors.

The power consumption of the memory controller may increase when the number of estimated errors is over a threshold value.

The error search on the part of the read vector may exclude an error search on a parity portion of the read vector when the number of estimated errors is below a threshold value.

The estimating of the number of errors may include calculating a syndrome (code) from the read vector, calculating an error location polynomial from the syndrome code, and setting the estimated number of errors based on the error location polynomial.

The setting of the estimated number of errors based on the error location polynomial may include setting the estimated number of errors based on an index of the highest degree of the error location polynomial.

The error search may be performed on the part by selecting a number of bits to be searched of the read vector.

The performing of the error search on the entire read vector may include performing a normal chien search when the estimated error number is over a threshold value. The performing of the error search on the part of the read vector may include performing a parity-skipped chien search when the estimated error number is below a threshold value.

According to an exemplary embodiment of the inventive concept, a memory controller includes an ECC encoder and an ECC decoder. The ECC encoder is configured to generate a code vector to be written in a memory device by encoding a write data vector. The ECC decoder is configured to correct one or more errors in a read vector read from the memory device and to output an error-corrected data vector. Power consumption of the ECC decoder is adjusted according to an estimated number of errors in the read vector.

The power consumption may increase when the estimated number of errors in the read vector is over a threshold value.

The read vector may include a data portion and a parity portion, where an error search on a parity portion of the read vector is omitted when the number of estimated errors in the read vector is below a threshold value.

The ECC decoder may include a syndrome calculation unit configured to calculate a syndrome code from the read vector, a key equation solving unit configured to calculate an error location polynomial based on the syndrome code, a chien search unit configured to calculate error location information based upon the error location polynomial, an error correcting unit configured to correct one or more errors in the read vector based on the error location information, and a controller configured to measure the number of errors in the read vector from the error location polynomial and to control power consumption of the chien search unit according to the estimated error number.

The controller may control the chien search unit to skip a search operation on a parity portion of the read vector when the estimated error number is below a threshold value.

The controller may be configured to determine the estimated number of errors of the read vector based on an index of the highest degree of the error location polynomial.

According to an exemplary embodiment of the invention, a method of operating a memory controller to control a memory device includes reading a read vector from the memory device that comprises a data portion and a parity portion, estimating a number of errors from the read vector, changing an operating mode of the memory controller from a normal mode to a power-saving mode when the number of estimated errors is less than a threshold value. During the power-saving mode, the method includes performing an error search on only the data portion to determine actual errors in the read vector and correcting the determined actual errors in the read vector. During the normal mode, the method may include performing an error search on both the data portion and the parity portion to determine actual errors and correcting the determined actual errors in the read vector.

The error searches may be forward chien searches. The estimating may include generating a syndrome code by multiplying the read vector by a parity check matrix, generating a polynomial from the syndrome code, and setting the estimated number of errors to the number of roots of the polynomial. The method may further include outputting the read vector when the syndrome code is zero and outputting data of the correcting otherwise.

BRIEF DESCRIPTION OF THE FIGURES

Embodiments of the inventive concept will become apparent from the following description with reference to the following figures, wherein like reference numerals refer to like parts throughout the various figures unless otherwise specified.

DETAILED DESCRIPTION

Figure 1:
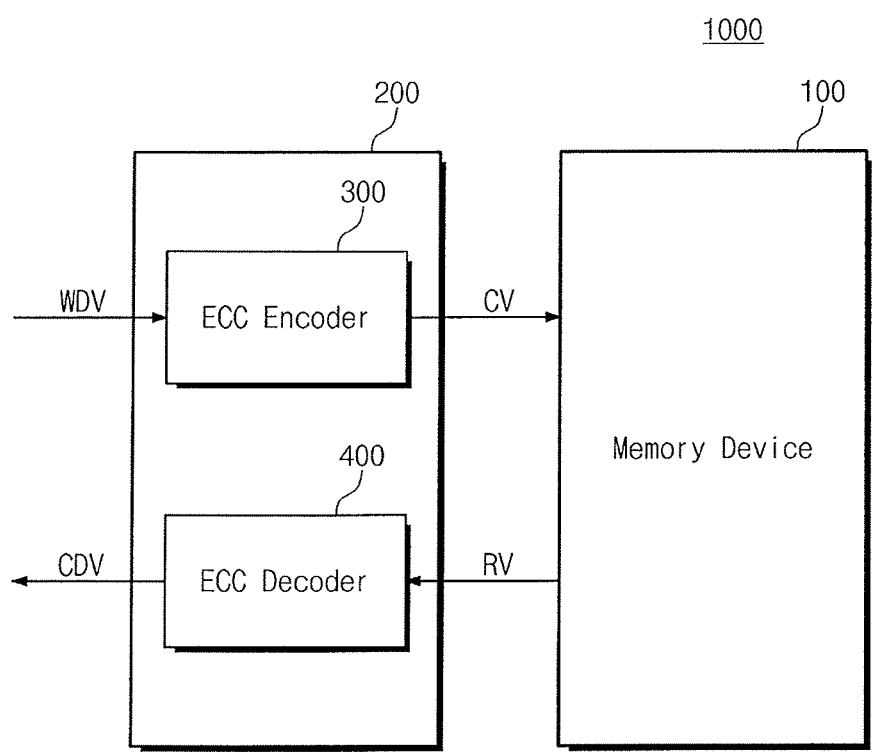
FIG. 1 is a block diagram illustrating a memory system according to an exemplary embodiment of the inventive concept.

The inventive concept is described more fully hereinafter with reference to the accompanying drawings, in which exemplary embodiments of the inventive concept are shown. The inventive concept may, however, be embodied in many different forms and should not be construed as limited to the exemplary embodiments set forth herein. In the drawings, the size and relative sizes of layers and regions may be exaggerated for clarity. Like numbers refer to like elements throughout.

As used herein, the singular forms "a", "an" and "the" are intended to include the plural forms as well, unless the context clearly indicates otherwise.

It will be understood that when an element or a layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a memory system according to an exemplary embodiment of the inventive concept. Referring to FIG. 1, a memory system 1000 includes a memory device 100 and a controller 200.

In an embodiment, the memory device 100 is configured to operate according to the control of the controller 200. In an embodiment, the memory device 100 stores a code vector CV input from the controller 200. In an embodiment, a vector stored in the memory device 100 is read out for output to the controller 200 as a read vector RV. The memory device 100 may be configured to enable deletion of stored vectors. The memory device 100 may include a volatile memory device such as an SRAM, a DRAM, an SDRAM, etc. or a nonvolatile memory device such as a ROM, a PROM, an EPROM, an EEPROM, a flash memory, a PRAM, an MRAM, an RRAM, a FRAM, etc.

In an embodiment, the controller 200 is coupled with the memory device 100. The controller 200 may be configured to access the memory device 100 in response to a request from a host. In an embodiment, the controller 200 includes an ECC encoder 300 and an ECC decoder 400.

In an embodiment, the ECC encoder 300 is configured to receive a write data vector WDV from a host and to encode the input write data vector WDV to a code vector CV. In an embodiment, the code vector CV is sent to the memory device 100. In an embodiment, the ECC decoder 400 is configured to receive the read vector RV from the memory device 100. In an embodiment, the ECC decoder 400 corrects an error of the read vector RV. The ECC decoder 400 may extract an error-corrected data vector CDV from an error-corrected read vector to send the extracted error-corrected data vector CDV to the host.

The controller 200 may communicate with the host according to various communication protocols. For example, the controller 200 may communicate with the host according to at least one of various communication protocols such as a Universal Serial Bus (USB) protocol, a multimedia card (MMC) protocol, a peripheral component interconnection (PCI) protocol, a PCI-express (PCI-express) protocol, an Advanced Technology Attachment (ATA) protocol, a Serial-ATA protocol, a Parallel-ATA protocol, a small computer small interface (SCSI) protocol, an ESDI enhanced small disk interface (ESDI) protocol, an Integrated Drive Electronics (IDE) protocol, FireWire, etc.

The controller 200 and the memory device 100 may be integrated in a single semiconductor device. The controller 200 and the memory device 100 may be integrated in a single semiconductor device to form a solid state drive (SSD). The controller 200 and the memory device 100 may be integrated in a single semiconductor device to form a memory card. For example, the controller 200 and the memory device 100 may be integrated in a single semiconductor device to form a memory card such as a PC (PCMCIA) card, a compact flash (CF) card, an SM (or, SMC) card, a memory stick, a multimedia card (e.g., MMC, RS-MMC, MMCmicro, etc.), a secure digital card (e.g., SD, miniSD, microSD, SDHC, etc.), a universal flash storage (UFS) device, etc.

In some exemplary embodiments, the memory system 1000 may be used in a computer, a portable computer, an Ultra Mobile PC (UMPC), a workstation, a net-book, personal digital assistant (PDA), web tablet, wireless phone, mobile phone, smart phone, e-book, portable multimedia player (PMP), digital camera, digital audio recorder/player, digital picture/video recorder/player, portable game machine, navigation system, black box, 3-dimensional television, a device capable of transmitting and receiving wireless information, one of various electronic devices constituting a home or a home area network (HAN), one of various electronic devices constituting a computer network, one of various electronic devices constituting a telematics network, a radio frequency identification RFID reader or tag, or one of various electronic devices constituting a computing system.

In an exemplary embodiment, a memory device 100 or a memory system 1000 may be packed by various types of packages such as Package on Package (POP), Ball grid arrays (BGAs), Chip scale packages (CSPs), a Plastic Leaded Chip Carrier (PLCC), a Plastic Dual In-Line Package (PDI2P), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), etc.

Figure 2:
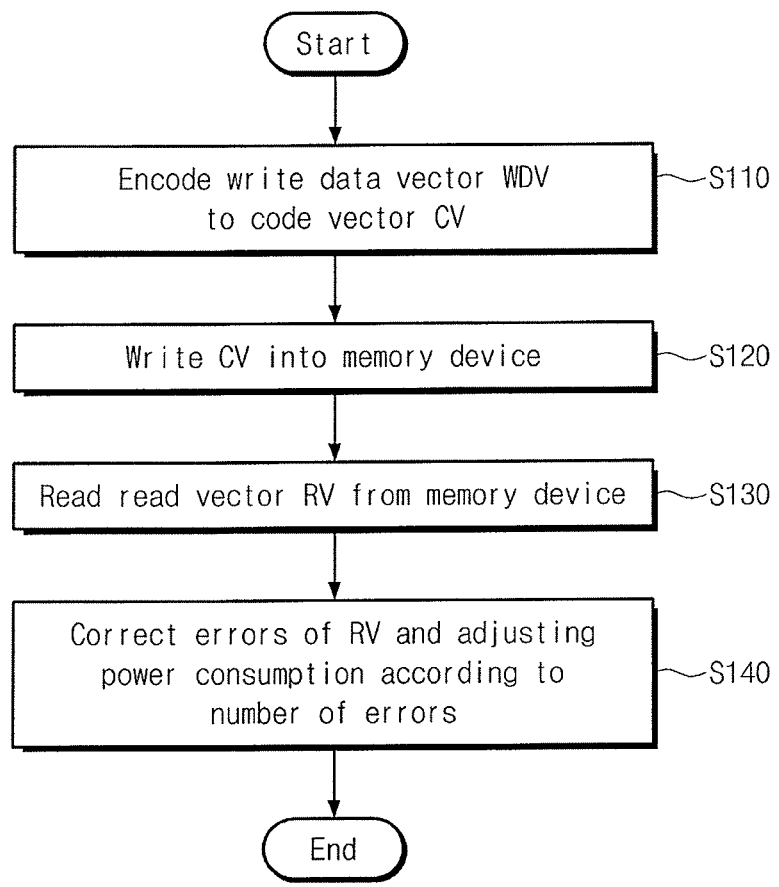
FIG. 2 is a flowchart for describing a method of operating a controller in FIG. 1 according to an exemplary embodiment of the inventive concept.

FIG. 2 is a flowchart for describing a method of operating a controller in FIG. 1 according to an exemplary embodiment of the inventive concept. Referring to FIGS. 1 and 2, in operation S110, an ECC encoder 300 encodes a write data vector WDV to a code vector CV. In operation S120, the code vector CV is written to a memory device 100.

In operation S130, a read vector RV is read from the memory device 100. In operation S140, an ECC decoder 400 adjusts power consumption according to the number of errors of the read vector RV and may correct errors of the read vector RV. Below, the operations S110 and S140 will be more fully described sequentially.

Figure 3:
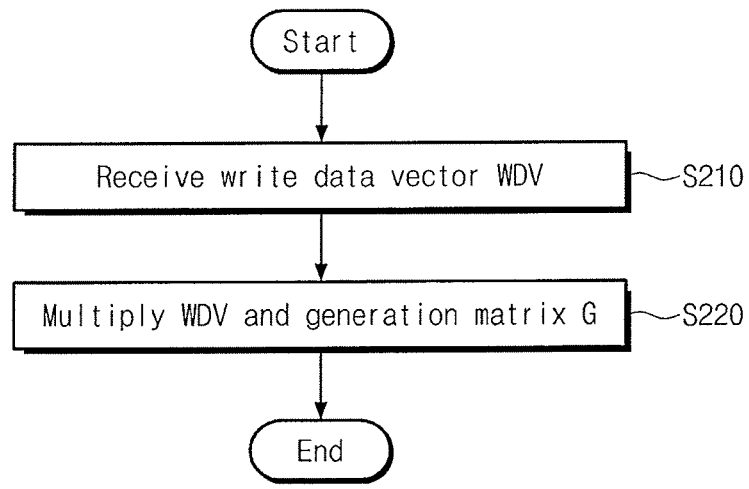
FIG. 3 is a flowchart for describing a method of encoding a write data vector in FIG. 2 according to an exemplary embodiment of the inventive concept.

FIG. 3 is a flowchart for describing an operation S110 of encoding a write data vector WDV in FIG. 2. Referring to FIGS. 1 and 3, in operation S210, an ECC encoder 300 receives a write data vector WDV. For example, the write data vector WDV may be received from an external host. A read vector RV may be read from a memory device 100, an error of the read vector RV may be corrected, an error-corrected data vector CDV may be extracted from the read vector RV, and the extracted error-corrected data vector CDV may be used as a write data vector WDV.

In operation S220, the ECC encoder 300 multiplies a generation matrix G by the write data vector WDV. For example, the generation matrix G may be a generation matrix G of a BCH Bose-Chaudhuri-Hocquenghem (BCH) code. A multiplication result may be a code vector CV.

Figure 4:
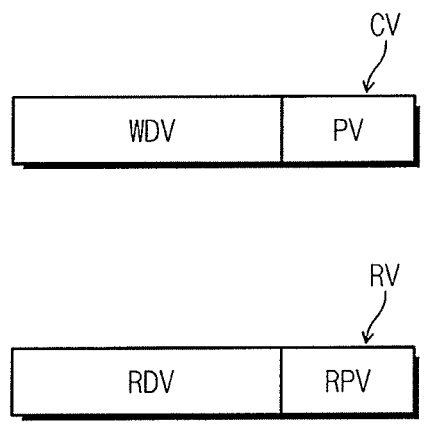
FIG. 4 is a diagram illustrating a code vector and a read vector according to an exemplary embodiment of the inventive concept.

FIG. 4 is a diagram illustrating a code vector and a read vector according to an exemplary embodiment of the inventive concept. Referring to FIG. 4, a code vector CV includes a write data vector WDV and a parity vector PV. The parity vector PV may be a cyclic redundancy check code (CRCC). The read vector RV includes a read data vector RDV and a read parity vector RPV. In the event that the write data vector WDV is written in and then read from the memory device 100, the read data vector RDV may be the read result. In the event that the read parity vector RPV is written in and then read from the memory device 100, the read parity vector RPV may be the read result.

Figure 5:
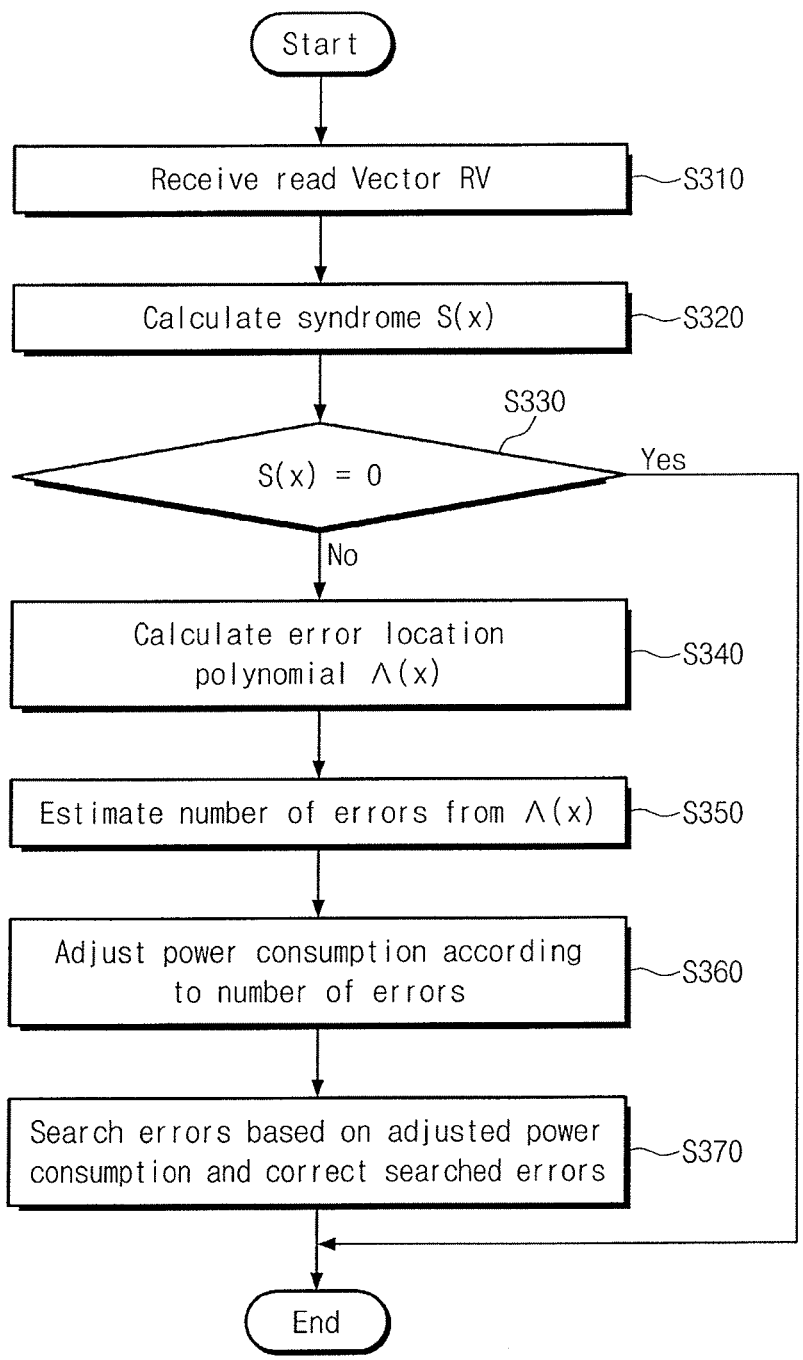
FIG. 5 is a flowchart for describing a read vector decoding operation with power consumption being controlled according to an exemplary embodiment of the inventive concept.

FIG. 5 is a flowchart for describing a read vector decoding operation with power consumption being controlled according to an exemplary embodiment of the invention. Referring to FIGS. 1 and 5, in operation S310, a read vector RV is received. In operation S320, a syndrome code $S(x)$ is calculated according to the read vector RV. An ECC decoder 400 may calculate the syndrome code $S(x)$ depending on the input read vector RV. In an embodiment, the syndrome code $S(x)$ is calculated using syndrome decoding, which is a method of decoding a linear code over a noisy channel. A hamming code is an example of a syndrome code. In operation S330, a determination is made as to whether the syndrome code $S(x)$ is 0. If the syndrome code $S(x)$ is 0, it may indicate that no error is present in the read vector RV. Accordingly, the ECC decoder 400 may end an error correcting operation. If the syndrome code S(x) is determined not to be 0, the procedure continues to operation S340.

In operation S340, an error location polynomial Λ(x) is calculated. The ECC decoder 400 may calculate the error location polynomial Λ(x) based on the calculated syndrome code S(x).

In operation S350, the number of errors is estimated from the error location polynomial Λ(x). For example, the ECC decoder 400 may estimate the number of errors of the read vector RV based on an index of the highest degree of the error location polynomial Λ(x). For example, the polynomial may have a number of terms, where each is raised to a different power, and the term with the highest power may be referred to as the highest degree. In another example, the polynomial may include at least one term having two sub-terms that are multiplied by one another, where each sub-term is raised to a power, the degree of the term is the sum of powers of the sub-terms, and the degree of the polynomial is the highest sum.

In operation S360, power consumption is adjusted according to the estimated error number. For example, the ECC decoder 400 may increase power consumption when the number of errors in the read vector RV is over a threshold value. The ECC decoder 400, for example, may reduce power consumption when the number of errors in the read vector RV is below a threshold value.

The ECC decoder 400 may adjust power consumption by selectively conducting an error search on all or part of the read vector RV. For example, if power needs to be conserved, the ECC decoder 400 can restrict its error search to one part of the read vector RV and omit its search from the remaining part.

In operation S370, errors in the read vector RV are searched according to the adjusted power consumption, and the searched errors are corrected.

Figure 6:
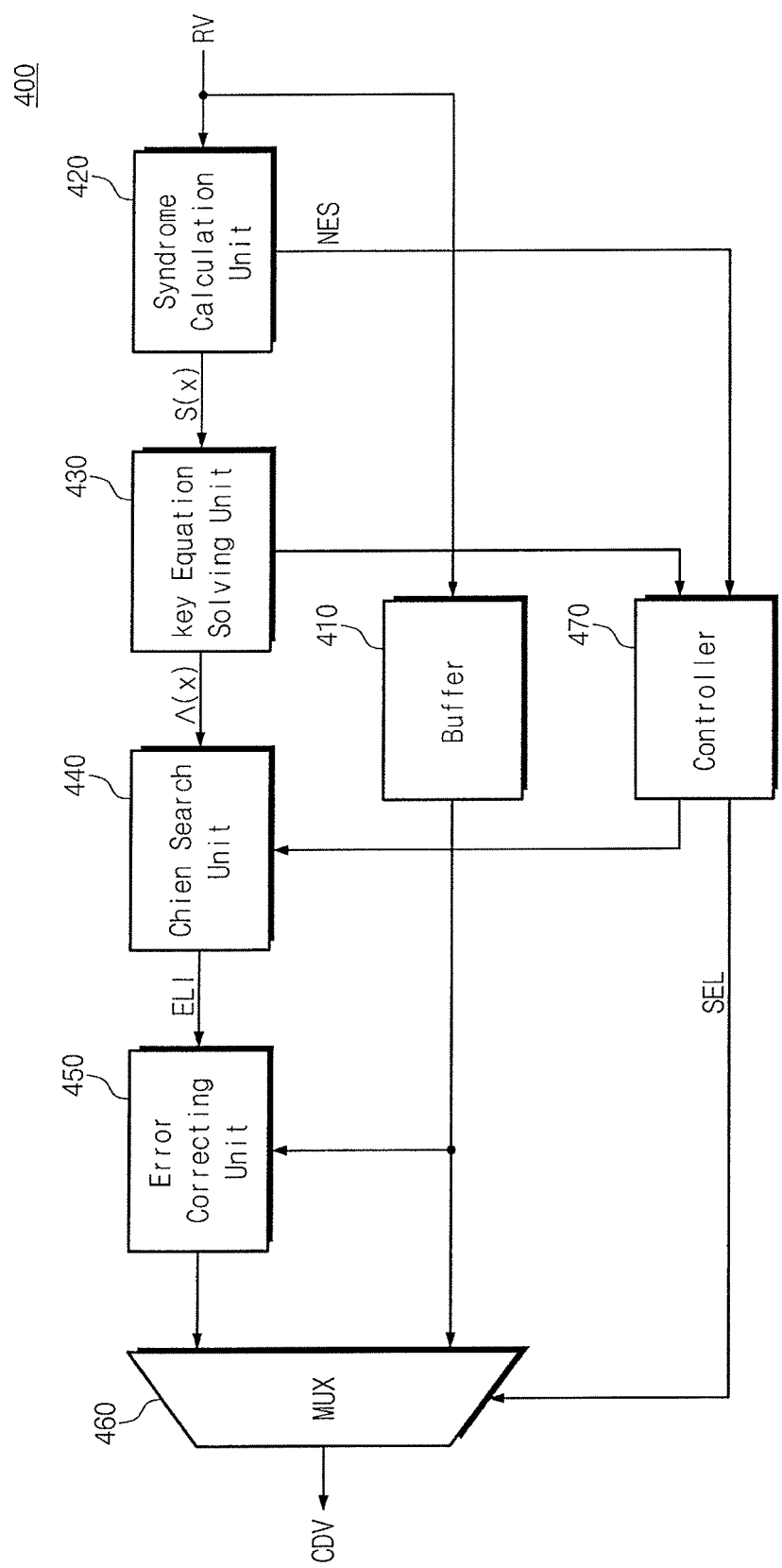
FIG. 6 is a block diagram illustrating an ECC decoder in FIG. 1 according to an exemplary embodiment of the inventive concept.

FIG. 6 is a block diagram illustrating an ECC decoder 400 in FIG. 1 according to an exemplary embodiment of the inventive concept. Referring to FIG. 6, the ECC decoder 400 includes a buffer 410, a syndrome calculation unit 420, a key equation solving (KES) unit 430, a chien search unit 440, an error correcting unit 450, a multiplexer 460, and a controller 470.

The buffer 410 may be configured to store a read vector RV read from a memory device 100. The read vector RV stored in the buffer 410 may be output to the error correcting unit 450 and the multiplexer 460.

The syndrome calculation unit 420 may be configured to calculate a syndrome code S(x) based on the read vector RV read from the memory device 100. The calculated syndrome S(x) may be output to the KES unit 430. When the calculated syndrome code S(x) is 0, the syndrome calculation unit 420 may activate a control signal NES. In an embodiment, the activated control signal NES indicates that no errors are present in the read vector RV.

The KES unit 430 may be configured to calculate an error location polynomial Λ(x) based on the calculated syndrome code S(x). The calculated error location polynomial Λ(x) may be output to the chien search unit 440. The KES unit 430 may output the error location polynomial Λ(x) or information about an index of the error location polynomial Λ(x) to the controller 470.

The chien search unit 440 may be configured to search error locations of the read vector RV based on the calculated error location polynomial Λ(x). For example, the chien search unit 440 may search the calculated error location polynomial Λ(x). The search result may correspond to error locations of the read vector RV. For example, an operation of searching error locations of the read vector RV may include searching the error location polynomial Λ(x) and determining error locations of the read vector RV according to the search result. Information about error locations of the read vector RV may be output to the error correcting unit 450 as error location information ELI.

The error correcting unit 450 may be configured to correct errors of the read vector RV stored in the buffer 410 using the error location information ELI. For example, the error correcting unit 450 may invert bits corresponding to the error location information ELI among bits of the read vector RV. An output of the error correcting unit 450 may be provided to the multiplexer 460.

The multiplexer 460 may select a vector output from the buffer 410 or a vector output from the error correcting unit 450 as an error-corrected data vector CDV according to the control of the controller 470. For example, when no errors are present in the read vector RV, the multiplexer 460 selects the vector output from the buffer 410.

The controller 470 may be configured to control an overall operation of the ECC decoder 400. The controller 470 may receive the control signal NES from the syndrome calculation unit 420. When the control signal NES is activated, that is, when the calculated syndrome code S(x) is 0, the controller 470 may control a selection signal SEL such that the multiplexer 460 selects an output of the error correcting unit 450.

The controller 470 may measure/estimate the number of errors of the read vector RV using the error location polynomial Λ(x) transferred from the KES unit 430 or information on the error location polynomial Λ(x). For example, the controller 470 may determine an index of the highest degree of the error location polynomial Λ(x) as the number of errors of the read vector RV. Based on the measured/estimated error number, the controller 470 may adjust power consumption of the chien search unit 440. The controller 470, for example, may increase the power consumption of the chien search unit 440 when the number of errors is over a threshold value. The controller 470, for example, may decrease the power consumption of the chien search unit 440 when the number of errors is below the threshold value. In an exemplary embodiment, the controller 470 may adjust power consumption of the chien search unit 440 by searching all or part of error locations of the read vector RV. For example, the chien search unit 440 may use less power when it searches part of the error locations and more power when it searches all of the error locations.

Figure 7:
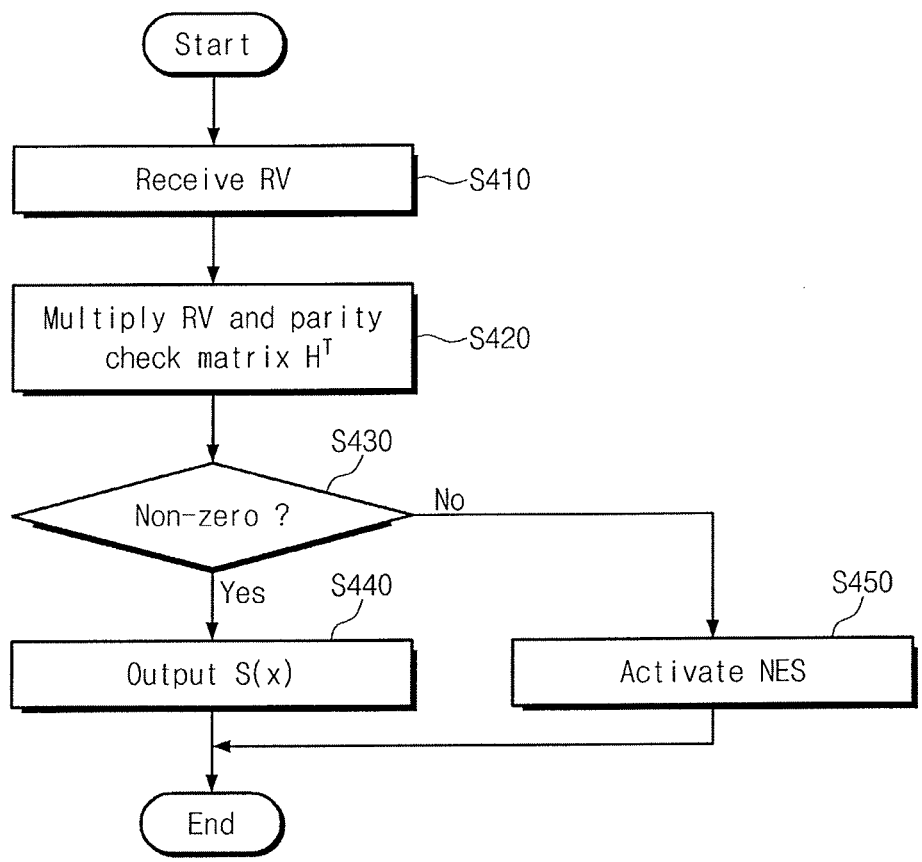
FIG. 7 is a flowchart for describing a syndrome calculating method according to an exemplary embodiment of the inventive concept.

FIG. 7 is a flowchart for describing a syndrome calculating method according to an exemplary embodiment of the inventive concept. Referring to FIGS. 6 and 7, in operation S410, a read vector RV is received. For example, the read vector RV may be provided to a syndrome calculation unit 420 from a memory device 100.

In operation S420, the read vector RV is multiplied with a parity check matrix $H^T$. The syndrome calculation unit 420 may previously store the parity check matrix $H^T$. The syndrome calculation unit 420 may multiply the previously stored parity check matrix $H^T$ and the read vector RV received from the memory device 100. A multiplication result may be a syndrome code S(x).

In operation S430, it is determined whether the multiplication result, that is, the syndrome code S(x) is 0. If the multiplication result, that is, the syndrome code S(x) is determined not to be 0, the procedure continues to operation S440, in which the syndrome code S(x) is output. If the multiplication result, that is, the syndrome code S(x) is determined to be 0, in operation S450, a control signal NES is activated.

The syndrome calculation unit 420 may determine whether the calculated syndrome code S(x) is 0. If the calculated syndrome code S(x) is non-zero, the syndrome calculation unit 420 may output the calculated syndrome code S(x) to a KES unit 430. If the calculated syndrome code S(x) is 0, the syndrome calculation unit 420 may activate the control signal NES.

Below, a syndrome calculating method according to an exemplary embodiment of the inventive concept will be described using the following equations. A code vector CV may be expressed by the following equation 1.

$$CV=WDV \times G \tag{1}$$

A read vector RV read from the memory device 100 may include an error. A read vector RV including an error may be expressed by the following equation 2.

$$RV=WDV \times G+E \tag{2}$$

In the equation 2, E may indicate an error vector.

The read vector RV may be multiplied with a parity check matrix $H^T$. A multiplication result may be expressed by the following equation.

$$RV \times H^T = WDV \times G \times H^T + E \times H^T \tag{3}$$

A generation matrix G and the parity check matrix $H^T$ may be determined to satisfy a relationship of the following equation.

$$G \times H^T \tag{4}$$

Accordingly, the following equation 5 may be obtained by substituting the equation 4 into the equation 3.

$$RV \times H^T = E \times H^T \tag{5}$$

A multiplication result may be the syndrome code S(x). If the syndrome code S(x) is 0, it may indicate that no error is present. If the syndrome code S(x) is non-zero, it may indicate that an error is present.

Figure 8:
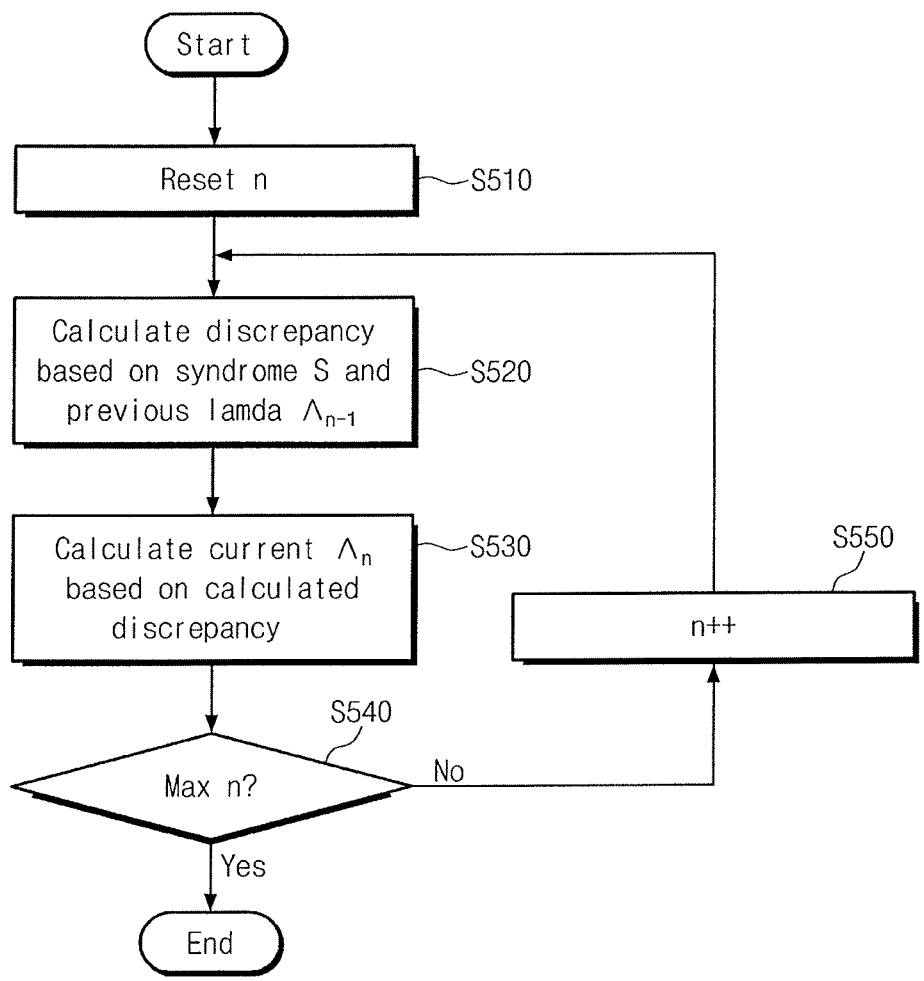
FIG. 8 is a flowchart for describing an error location polynomial calculating method according to an exemplary embodiment of the inventive concept.

FIG. 8 is a flowchart for describing an error location polynomial ($\Lambda(x)$) calculating method according to an exemplary embodiment of the inventive concept. Referring to FIGS. 6 and 8, in operation S510, a variable n is reset. For example, a KES unit 430 may reset the variable n.

In operation 5520, a discrepancy is calculated using a syndrome code S(x) and a coefficient $\Lambda_{n-1}$ of a previous step. If the coefficient $\Lambda_{n-1}$ of a previous step is not present, that is, in the event that only the first coefficient $\Lambda_0$ has been calculated, the discrepancy may be calculated based on the syndrome code S(x) alone. The discrepancy may be calculated by a KES unit 430.

In operation S530, a coefficient $\Lambda_n$ is calculated according to the calculated discrepancy. The coefficient $\Lambda_n$ may be calculated by the KES unit 430.

In operation S540, it is determined whether a value of the variable n corresponds to a maximum value. If so, calculation of the error location polynomial $\Lambda(x)$ ends. If not, in operation S550, the variable n is incremented. Afterwards, the method proceeds to operation S520.

Until a value of the variable n reaches the maximum value, the KES unit 430 continues to increment the variable n and may iteratively calculate the coefficient $\Lambda_n$. The calculated coefficient $\Lambda_n$ may be a coefficient of a degree n of the error location polynomial $\Lambda(x)$. In an exemplary embodiment, the error location polynomial $\Lambda(x)$ may be expressed by the following equation 6.

$$\Lambda(x)=\Lambda_0+\Lambda_1 x+\Lambda_2 x^2+\ldots+\Lambda_n x^n \tag{6}$$

Roots of the error location polynomial $\Lambda(x)$ may indicate error locations of the read vector RV. For example, the read vector RV may include errors corresponding to the number of roots of the error location polynomial $\Lambda(x)$. In an embodiment, a root is a value that causes the error location polynomial to be 0. An index of the highest degree (e.g., an index of the highest degree having a non-zero coefficient) of the error location polynomial $\Lambda(x)$ may indicate the number of errors.

In an exemplary embodiment, key equation solving (KES) calculation is made according to the Berlekamp-Massey (BM) algorithm or the Modified Euclidean (ME) algorithm.

Figure 9:
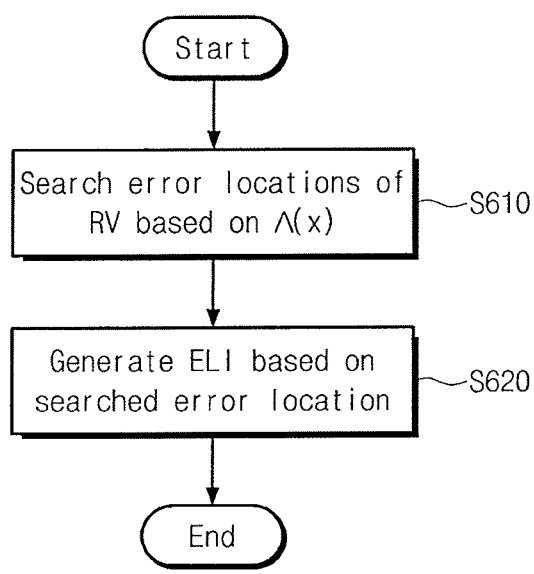
FIG. 9 is a flowchart for describing a chien search method according to an exemplary embodiment of the inventive concept.

FIG. 9 is a flowchart for describing a chien search method according to an exemplary embodiment of the inventive concept. Referring to FIGS. 6 and 9, in operation S610, error locations of a read vector RV are searched depending on an error location polynomial $\Lambda(x)$. For example, forward chien search may be made from the first bit of an end of a data side of the read vector RV to a last vector.

The chien search unit 440 may conduct a search operation on the error location polynomial $\Lambda(x)$. The chien search unit 440 may search roots of the error location polynomial $\Lambda(x)$. The chien search unit 440 may determine error locations of the read vector RV depending on roots of the error location polynomial $\Lambda(x)$. A search operation of the chien search unit 440 may correspond to an operation of searching error locations from the first bit of an end of a data side of the read vector RV to a last vector.

In operation S620, error location information ELI is generated according to the searched error locations. The chien search unit 440 may output the error location information ELI based on the error locations of the read vector RV. The error location information ELI may be output to an error correcting unit 450.

Roots of the error location polynomial $\Lambda(x)$ may be obtained via execution of the chien search. In an exemplary embodiment, when the error location polynomial $\Lambda(x)$ satisfies the following equation 7, a square number $\alpha^i$ of a primitive element $\alpha$ may be a root of the error location polynomial $\Lambda(x)$.

$$\Lambda(\alpha^i)=\Lambda_0+\Lambda_1 \alpha^i+\Lambda_2 \alpha^{2i}+\ldots+\Lambda_n \alpha^{ni}=0$$

or $$\Lambda_1 \alpha^i+\Lambda_2 \alpha^{2i}+\ldots+\Lambda_n \alpha^{ni}=-\Lambda_0 \tag{7}$$

Roots of the error location polynomial $\Lambda(x)$ may be expressed by an index form of the primitive element $\alpha$. Error locations of the read vector RV may be inverted values of indexes of roots of the error location polynomial $\Lambda(x)$. For example, when a root of the error location polynomial $\Lambda(x)$ is $(\alpha-k)$, the $(k+1)^{th}$ bit of the read vector RV may be an error bit. For example, the $(k+1)^{th}$ bit from an end of a parity side of the read vector RV may be an error bit. When the read vector RV has a c-bit length, roots of the error location polynomial $\Lambda(x)$ may be values between $\alpha^0$ and $\alpha^{-(c-1)}$.

Roots of the error location polynomial $\Lambda(x)$ may be searched via execution of the chien search. For example, error locations of the read vector RV may be determined according to the chien search result. The chien search unit 440 may output error location information ELI to an error correcting unit 450 according to the searching result. The error correcting unit 450 may correct errors of the read vector RV by inverting bits at locations designated by the error location information ELI.

Figure 10:
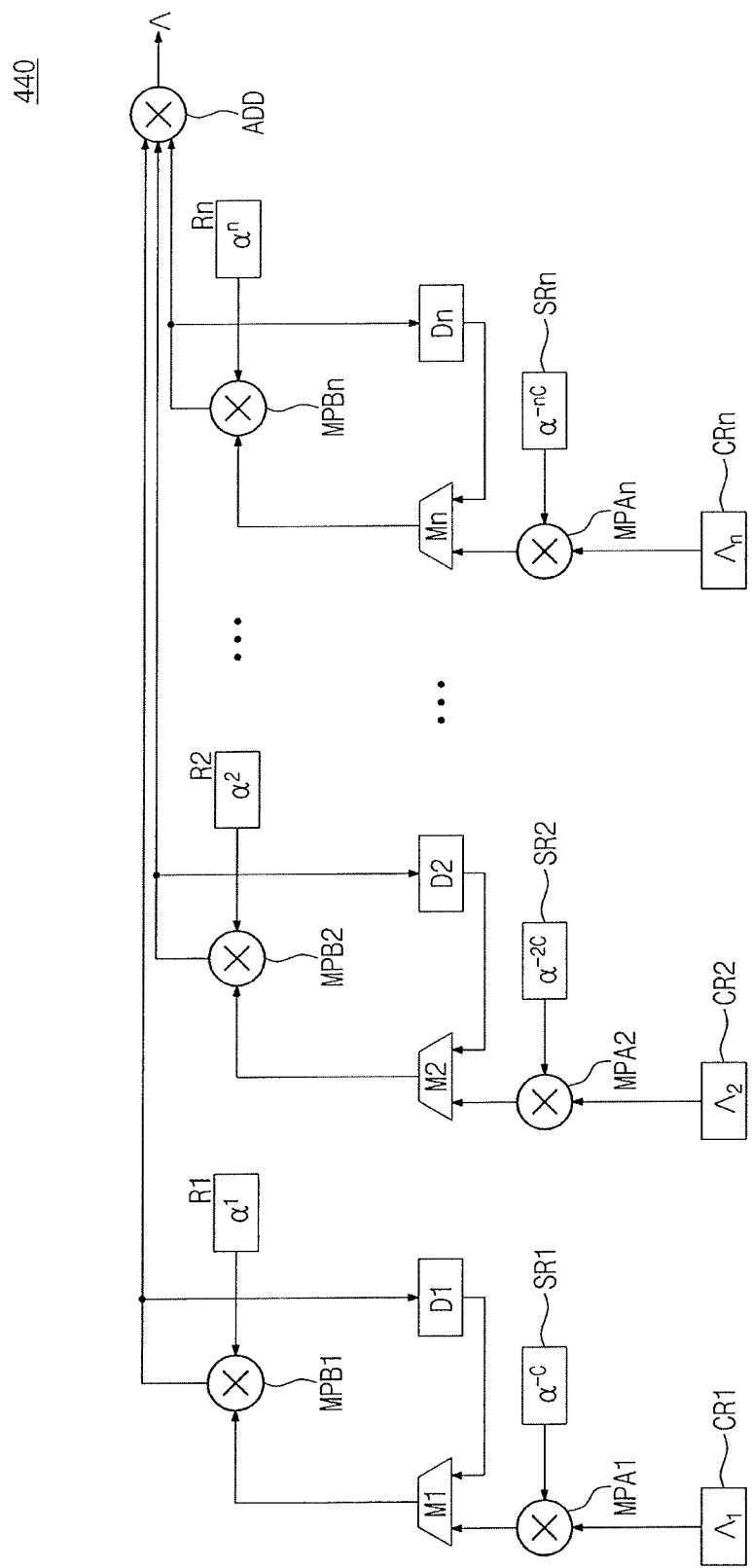
FIG. 10 is a diagram illustrating a chien search unit in FIG. 6 according to an exemplary embodiment of the inventive concept.

FIG. 10 is a diagram illustrating a chien search unit in FIG. 6 according to an exemplary embodiment of the inventive concept. Referring to FIG. 10, coefficients $\Lambda_1$ to $\Lambda_n$ of an error location polynomial $\Lambda(x)$ may be stored in coefficient registers CR1 to CRn, respectively. For example, the coefficients $\Lambda_1$ to $\Lambda_n$ of the error location polynomial $\Lambda(x)$ may be transferred from a KES unit 430 in FIG. 6.

Seeds may be stored in seed registers SR1 to SRn, respectively. In an exemplary embodiment, seeds stored in the seed registers SR1 to SRn may be square numbers of a primitive element $\alpha$. Seeds stored in the seed registers SR1 to SRn may be $\alpha^{-c}$ to $\alpha^{-nc}$, where 'c' may indicate a length of a read vector RV (e.g., the number of bits of the read vector RV).

In an embodiment, outputs of the coefficient registers CR1 to CRn and outputs of the seed registers SR1 to SRn are multiplied by the first multipliers MPA1 to MPAn, respectively. In an embodiment, multiplication results are transferred to the first inputs of multiplexers M1 to Mn, respectively. In the embodiment, outputs of delays D1 to Dn are provided to the second inputs of the multiplexers M1 to Mn, respectively.

In the embodiment, the multiplexers M1 to Mn select outputs of the first multipliers MPA1 to MPAn or outputs of the delays D1 to Dn. The multiplexers M1 to Mn may operate according to the control of a controller 470 in FIG. 6. In an embodiment, outputs of the multiplexers M1 to Mn may be transferred to the second multipliers MPB1 to MPBn, respectively.

Registers R1 and Rn may be provided. Square numbers $\alpha^1$, $\alpha^2$, ..., $\alpha^n$ of a primitive element $\alpha$ may be stored in the registers R1 to Rn, respectively. In an exemplary embodiment, each term may be obtained by removing a constant $\Lambda_0$ from an error location polynomial $\Lambda(x)$, replacing coefficients $\Lambda_1$ to $\Lambda_n$ with 1, and substituting the primitive element $\alpha$ into x.

The second multipliers MPB1 to MPBn multiply outputs of the multiplexers M1 to Mn and outputs of the registers R1 to Rn. Outputs of the second multipliers MPB1 to MPBn are added by an adder ADD. Outputs of the second multipliers MPB1 to MPBn are sent to the delays D1 to Dn, respectively.

At the first cycle of a chien search, the multiplexers M1 to Mn may be controlled to select outputs of the first multipliers MPA1 to MPAn. Outputs of the multiplexers M1 to Mn are transferred to the second multipliers MPB1 to MPBn, respectively. During the first cycle, an output $\Lambda$ of the adder ADD may be shown in the following table 1.

TABLE 1

| $1^{st}$ cycle | $\Lambda = \Lambda_1 \alpha^{-c} \alpha + \Lambda_2 \alpha^{-2c} \alpha^2 + ... + \Lambda_n \alpha^{-nc} \alpha^n =$ $\Lambda_1 \alpha^{-(c-1)} \alpha + \Lambda_2 \alpha^{-2(c-1)} + ... + \Lambda_n \alpha^{-n(c-1)}$ |
| --- | --- |

An output $\Lambda$ of the adder may be obtained by substituting $\alpha^{-(c-1)}$ into an error location polynomial $\Lambda(x)$. For example, whether the $(c-1)^{th}$ bit of the read vector RV is erroneous may be searched at the first cycle.

For example, a search may be performed for an error that is present at the first bit from an end of a data side of the read vector RV to a last vector. When the output $\Lambda$ of the adder ADD is $-\Lambda_1$ it may indicate that an error is present.

At the second cycle, the multiplexers M1 to Mn may select outputs of the delays D1 to Dn. For example, outputs of the registers R1 to Rn may be multiplied with outputs of the second multipliers MPB1 to MPBn at the second cycle. During the second cycle, an output $\Lambda$ of the adder ADD may be shown in the following table 2.

TABLE 2

| $1^{st}$ cycle | $\Lambda = \Lambda_1 \alpha^{-c} \alpha + \Lambda_2 \alpha^{-2c} \alpha^2 + ... + \Lambda_n \alpha^{-nc} \alpha^n =$ $\Lambda_1 \alpha^{-(c-1)} \alpha + \Lambda_2 \alpha^{-2(c-1)} + ... + \Lambda_n \alpha^{-n(c-1)}$ |
| --- | --- |
| $2^{nd}$ cycle | $\Lambda = \Lambda_1 \alpha^{-(c-1)} \alpha + \Lambda_2 \alpha^{-2(c-1)} \alpha^2 + ... + \Lambda_n \alpha^{-n(c-1)} \alpha^n =$ $\Lambda_1 \alpha^{-(c-2)} \alpha + \Lambda_2 \alpha^{-2(c-2)} + ... + \Lambda_n \alpha^{-n(c-2)}$ |

An output $\Lambda$ of the adder may be obtained by substituting $\alpha^{-(c-2)}$ into an error location polynomial $\Lambda(x)$. For example, a search may be performed to determine whether the second bit of the read vector RV is erroneous at the second cycle.

As described above, during the first cycle, a search may be performed to whether the first bit from an end of a data side of the read vector RV to a last vector is erroneous. During the second cycle, a search may be performed to determine whether the second bit from an end of a data side of the read vector RV to the last vector is erroneous. For example, a forward chien search may be performed in which an error is searched sequentially from an end of a data side of the read vector RV.

Figure 11:
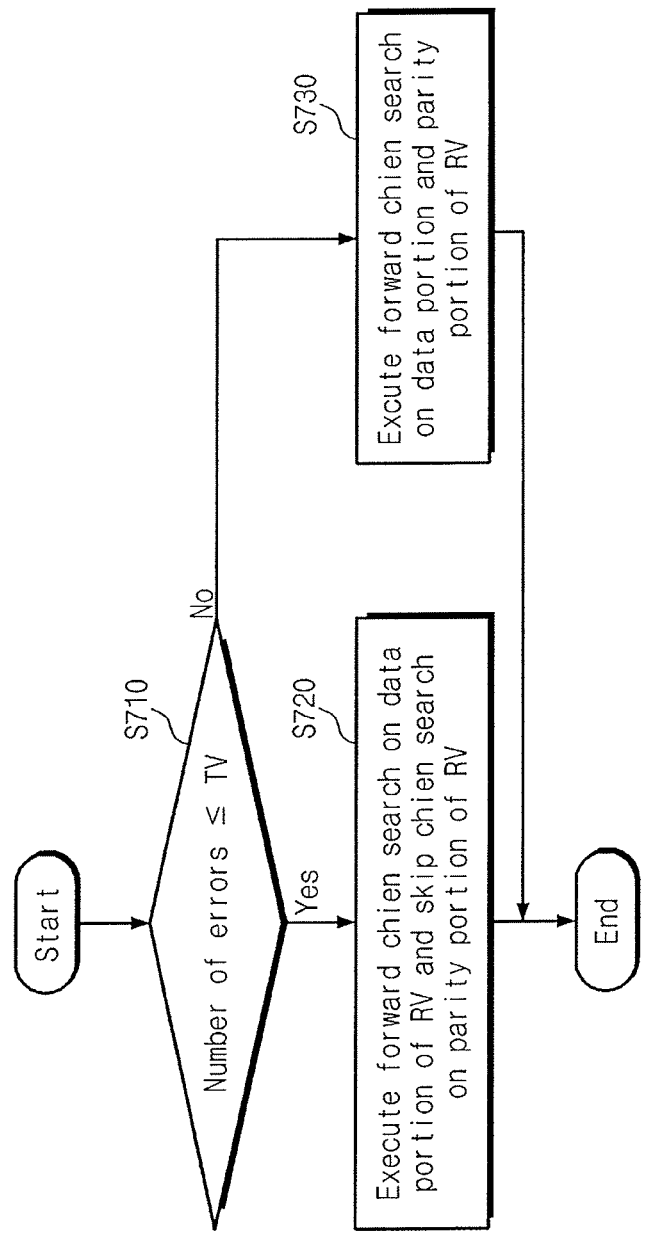
FIG. 11 is a flowchart for describing a power consumption adjusting method according to an exemplary embodiment of the inventive concept.

FIG. 11 is a flowchart for describing a power consumption adjusting method according to an exemplary embodiment of the inventive concept. Referring to FIGS. 6 and 11, in operation S710, it is determined whether the number of detected/estimated errors is below a threshold value TV.

If the number of detected errors is below the threshold value TV, in operation S720, a chien search is executed on a data portion of a read vector RV and a chien search on a parity portion thereof is skipped. If the number of detected errors is over the threshold value TV, in operation S730, a chien search is executed on the data and parity portions of the read vector RV.

When the number of detected errors is below the threshold value TV, a controller 470 may control a chien search unit 440 to perform a chien search on a data portion of the read vector RV. When the number of detected errors is over the threshold value TV, the controller 470 may control the chien search unit 440 to perform a chien search on data and parity portions of the read vector RV.

When an index $\Lambda_n$ of the highest degree of an error location polynomial $\Lambda(x)$ is '0', the number of errors in a read vector RV may be identical to or less than $(n-1)$. For example, when an index $\Lambda_n$ of the highest degree of the error location polynomial $\Lambda(x)$ is '0', an error-corrected read data vector may be obtained from the read vector RV even though a chien search is only performed on a data portion of the read vector RV.

When an index $\Lambda_n$ of the highest degree of the error location polynomial $\Lambda(x)$ is non-zero, the number of errors in the read vector RV may be identical to or more than n. A chien search on the read vector RV may be performed, and then additional error detecting and correcting operations may be required.

When an index $\Lambda_n$ of the highest degree of the error location polynomial $\Lambda(x)$ is '0', that is, when an error is capable of being corrected by an error search of a data portion of the read vector RV performed via the chien search, a chien search on a parity portion of the read vector RV may be skipped. An amount of power consumed by chien searches may be reduced by skipping a chien search on a parity portion of the read vector RV.

A margin may be provided to improve the reliability of an ECC decoder 400. For example, the threshold value TV may be set to 3. For example, when indexes $\Lambda_n$, $\Lambda_{n-1}$, and $\Lambda_{n-2}$ of three uppermost terms of an error location polynomial $\Lambda(x)$ are '0', a chien search on a parity portion of the read vector RV may be skipped. However, the threshold value TV is not limited to 3. The threshold value TV may be changed according to various conditions such as a structure of the ECC decoder 400, the reliability thereof, etc.

Figure 12:
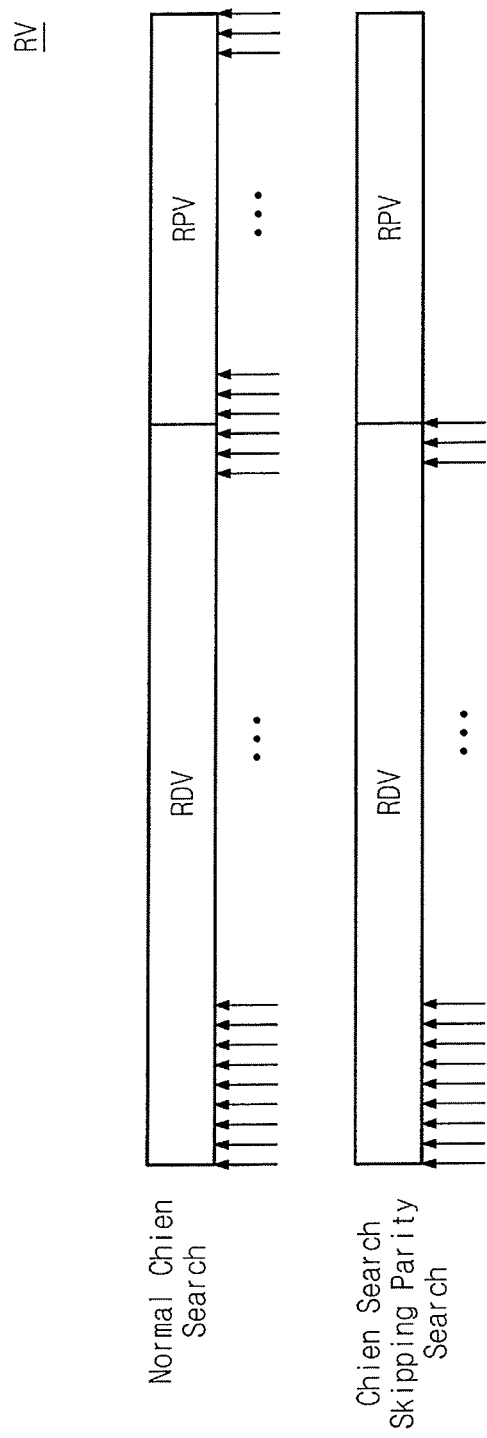
FIG. 12 is a diagram for describing normal chien search and parity-skipped chien search operations.

FIG. 12 is a diagram for describing normal chien search and parity-skipped chien search operations. Referring to FIG. 12, when a normal chien search is performed, a forward chien search may be made from a first bit of an end of a data side of a read vector RV to a last bit of the read vector RV. For example, the chien search may be made with respect to a read data vector RDV and a read parity vector RPV of the read vector RV.

When a chien search is made without parity search (or with a parity-skipped chien search), a forward chien search may be made from a first bit of an end of a data side of a read vector RV to a last bit of the read data vector. For example, the chien search may be made only with respect to a read data vector RDV of the read vector RV, and chien search on a read parity vector RPV thereof may be skipped.

Figure 13:
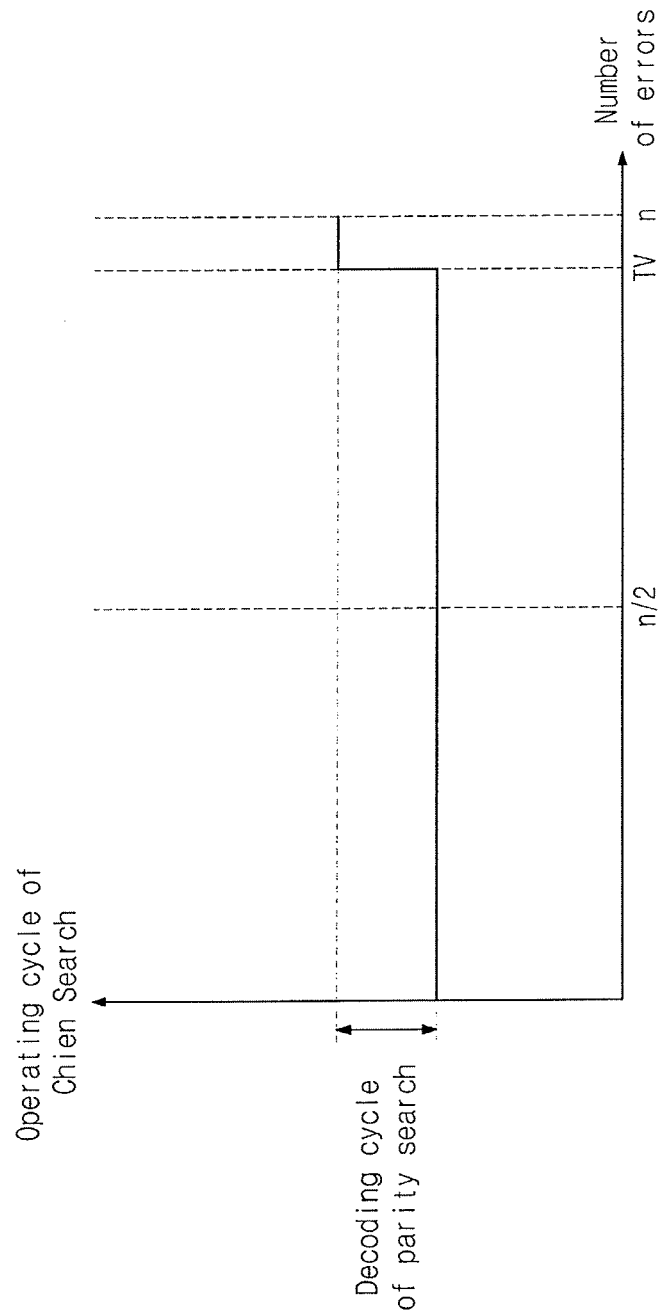
FIG. 13 is an exemplary diagram illustrating a decoding cycle of a chien search unit according to the number of errors.

FIG. 13 is an exemplary diagram illustrating a decoding cycle of a chien search unit according to the number of errors. In FIG. 13, a horizontal axis indicates the number of errors of a read vector RV, and a vertical axis indicates an error correction decoding cycle. A variable n may correspond to the maximum error correction bit number of an ECC decoder 400.

A chien search on a parity portion of the read vector RV may be skipped when the number of errors in a read vector RV is below a threshold value TV. When the number of errors of the read vector RV is over the threshold value TV, a chien search may be performed on data and parity portions of the read vector RV. For example, an operating cycle of the chien search 440 may be adjusted based on an example where the number of errors is the threshold value TV.

Figure 14:
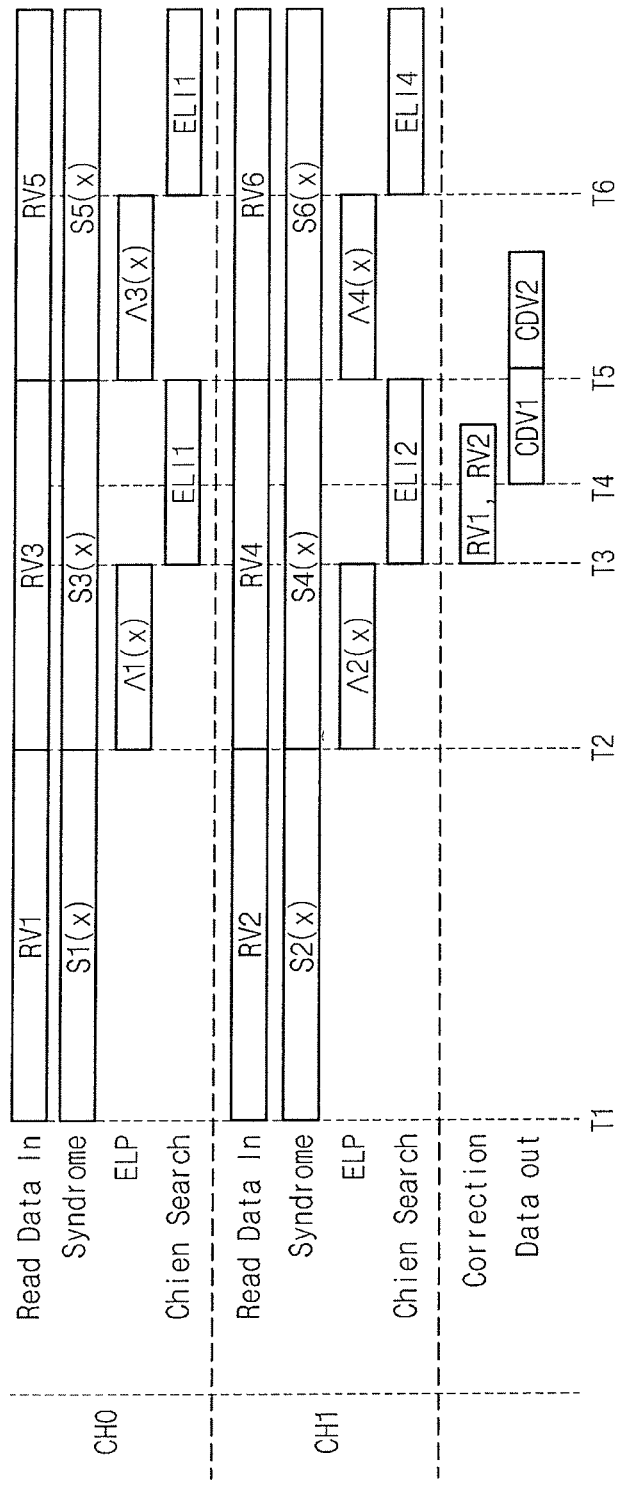
FIG. 14 is a timing diagram illustrating an error correction decoding operation according to an exemplary embodiment of the inventive concept.

FIG. 14 is a timing diagram illustrating an error correction decoding operation according to an exemplary embodiment of the inventive concept. In an exemplary embodiment, the number of errors of a read vector RV may be over a threshold value TV. Referring to FIGS. 6 and 14, at time T1, the first read vector RV1 is received from a channel CH0, and the second read vector RV2 is received from a channel CH1.

In an exemplary embodiment, the channels CH0 and CH1 may be independent from each other. The channels CH0 and CH1 may be connected with different memory devices. An ECC decoder 400 may be provided to be independent from the channels CH0 and CH1. Below, the ECC decoder 400 and its constituent elements may be described using the same reference numerals regardless of the channels CH0 and CH1.

A syndrome code S(x) may be calculated by multiplying a read vector RV and a parity check matrix $H^T$. The syndrome code S(x) may be calculated at an input of the read vector RV. A syndrome calculation unit 420 corresponding to the channel CH0 may calculate the first syndrome code S1(x) of the first read vector RV1. A syndrome calculation unit 420 corresponding to the channel CH1 may calculate the second syndrome code S2(x) of the second read vector RV2.

At time T2, inputs of the first and second read vectors RV1 and RV2 may end. Calculation of the first and second syndrome codes S1(x) and S2(x) may end when inputs of the first and second read vectors RV1 and RV2 end. The first and second syndrome codes S1(x) and S2(x) may be transferred to a KES unit 430. The KES unit 430 may calculate the first and second error location polynomials $\Lambda1(x)$ and $\Lambda2(x)$ based on the first and second syndrome codes S1(x) and S2(x).

The channels CH0 and CH1 and the syndrome calculation unit 420 may enter into a ready state. The third read vector RV3 may be received via the channel CH0, and the fourth read vector RV4 may be received via the channel CH1. The syndrome calculation unit 420 may calculate the third and fourth syndrome codes S3(x) and S4(x) from the third and fourth read vectors RV3 and RV4.

At time T3, calculation of the first and second error location polynomials $\Lambda1(x)$ and $\Lambda2(x)$ may end. The first and second error location polynomials $\Lambda1(x)$ and $\Lambda2(x)$ may be transferred to a chien search unit 440.

The chien search unit 440 may perform a chien search based on the first and second error location polynomials $\Lambda1(x)$ and $\Lambda2(x)$. The chien search unit 440 may conduct a search operation depending on the first and second error location polynomials $\Lambda1(x)$ and $\Lambda2(x)$. A forward chien search may be performed sequentially from an end of a data side of a read vector RV. According to the chien search result, an error may be detected and corrected sequentially from an end of a data side of the read vector RV. For example, error correction may be executed at the chien search at time T3.

The KES unit 420 may enter into a ready state.

If error correction of the first read vector RV1 has completed, the first error-corrected data vector CDV1 is output. At time T4, the first error-corrected data vector CDV1 is output. The second error-corrected data vector CDV2 is output following the first error-corrected data vector CDV1.

At time T5, inputs of the third and fourth read vectors RV3 and RV4 end and calculation of the third and fourth syndrome codes S3(x) and S4(x) end. Since the KES unit 430 is at a ready state, the third and fourth syndrome codes S3(x) and S4(x) may be transferred to the KES unit 430. The KES unit 430 may calculate the third and fourth error location polynomials $\Lambda3(x)$ and $\Lambda4(x)$ based on the third and fourth syndrome codes S3(x) and S4(x).

The channels CH0 and CH1 and the syndrome calculation unit 420 may enter into a ready state. The fifth read vector RV5 may be received via the channel CH0, and the sixth read vector RV6 may be received via the channel CH1. The syndrome calculation unit 420 may calculate the fifth and sixth syndrome codes S5(x) and S6(x) from the fifth and sixth read vectors RV5 and RV6.

At time T6, calculation of the third and fourth error location polynomials $\Lambda3(x)$ and $\Lambda4(x)$ has completed. The chien search unit 440 may start a chien search operation and the KES unit 430 may enter into a ready state. The third and fourth error location polynomials $\Lambda3(x)$ and $\Lambda4(x)$ may be transferred to the chien search unit 440. The chien search unit 440 may perform a chien search depending on the first and second error location polynomials $\Lambda1(x)$ and $\Lambda2(x)$.

Figure 15:
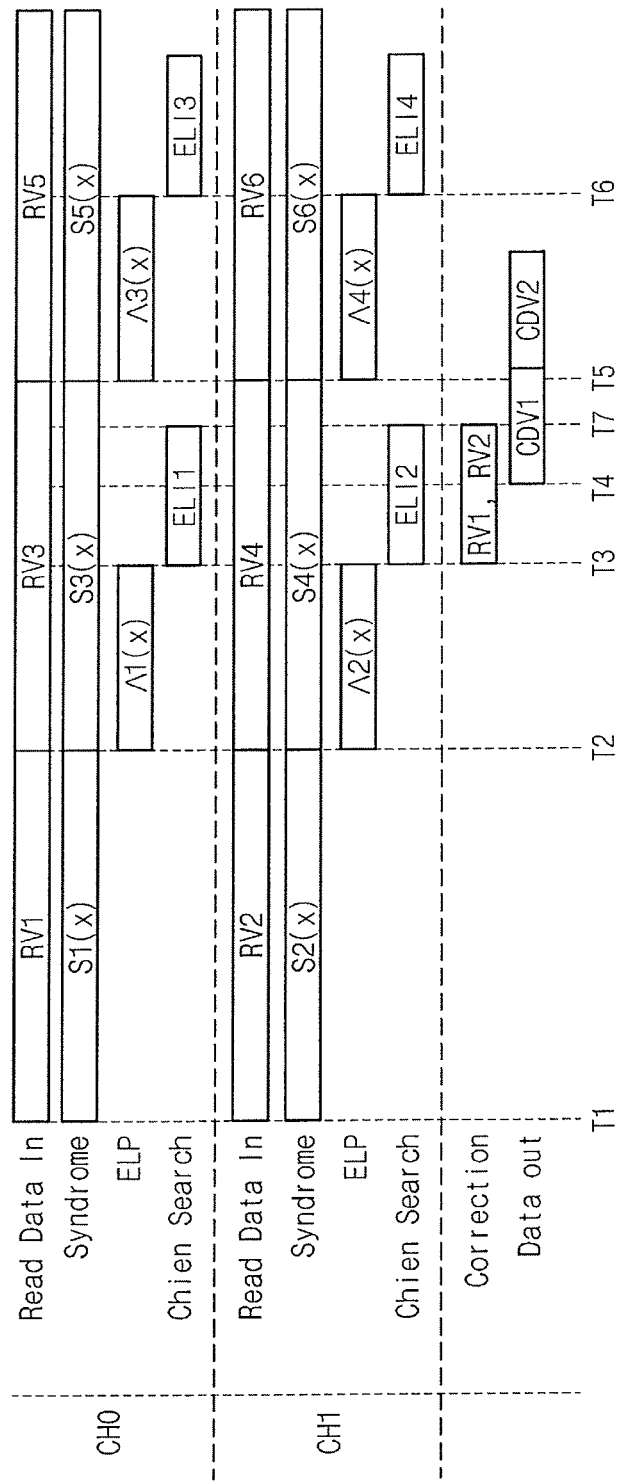
FIG. 15 is a timing diagram illustrating an error correction decoding operation according to an exemplary embodiment of the inventive concept.

FIG. 15 is a timing diagram illustrating an error correction decoding operation according to an exemplary embodiment of the inventive concept. In an exemplary embodiment, the number of errors of a read vector RV may be below a threshold value TV. A controller 470 may control a chien search unit 440 to skip a search operation on a parity portion of the read vector RV.

In FIG. 14, chien search may end at time T5. However, in FIG. 15, a chien search may end at time T7 preceding time T5. Since a chien search on a parity portion of the read vector RV is skipped, a chien search time may be shortened. If the chien search time is shortened, power consumption occurring due to chien searches may be reduced.

Figure 16:
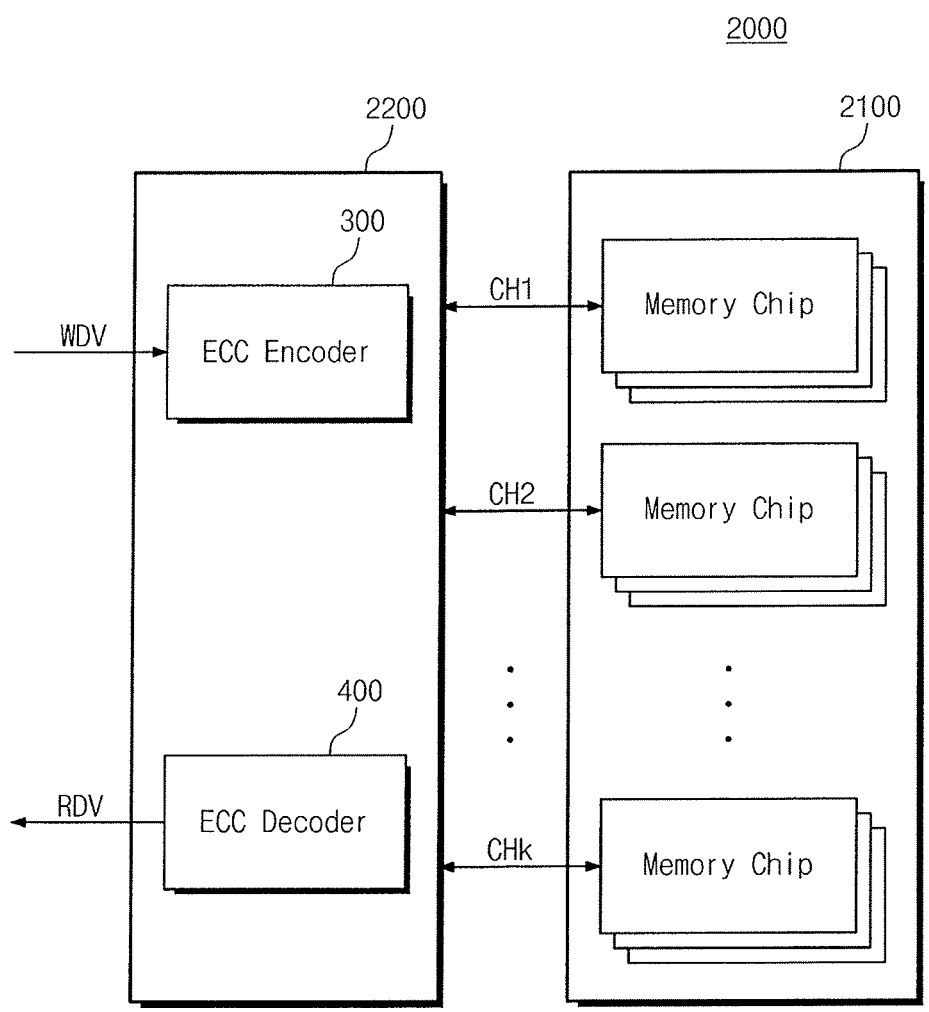
FIG. 16 is a block diagram illustrating an embodiment of a memory system in FIG. 1.

FIG. 16 is a block diagram illustrating an application of a memory system in FIG. 1 according to an exemplary embodiment of the inventive concept. Referring to FIG. 16, a memory system 2000 includes a memory device 2100 and a controller 2200. The memory device 2100 may include a plurality of memory chips, which are divided into a plurality of groups. Memory chips in each group may communicate with the controller 2200 via a common channel. In an exemplary embodiment, the memory chips communicating with the controller 2200 via channels CH1 to CHk are exemplarily shown in FIG. 16. Memory modules can be connected with the channels instead of the memory chips.

The controller 2200 may include an ECC encoder 300 and an ECC decoder 400. The ECC encoder 300 and the ECC decoder 400 may operate the same as described with reference to FIGS. 2 to 15. For example, the ECC decoder 400 may be configured to adjust power consumption according to the number of errors of a read vector RV and to make error correction.

In FIG. 16, an example is shown where a plurality of memory chips is connected with one channel. However, in alternate embodiments, the memory system 2000 may changed such that one channel is connected with one memory chip.

Figure 17:
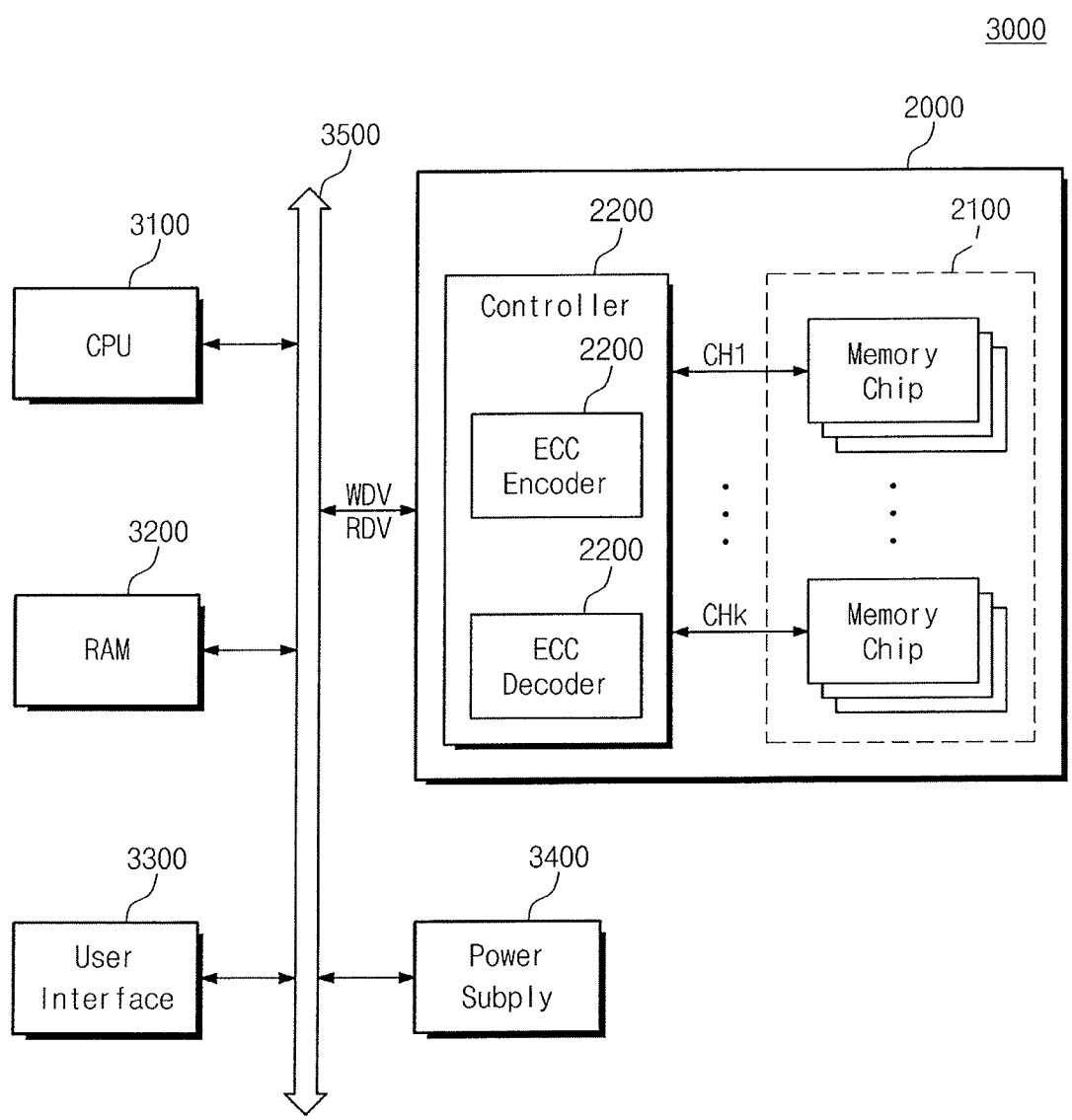
FIG. 17 is a block diagram illustrating an exemplary computing system including a memory system in FIG. 16.

FIG. 17 is a block diagram illustrating a computing system including a memory system in FIG. 16 according to an exemplary embodiment of the inventive concept. Referring to FIG. 17, a computing system 3000 may include a CPU 3100, a RAM 3200, a user interface 3300, a power supply 3400, and a memory system 2000.

The memory system 2000 may be electrically connected with the elements 3100 to 3400 via a system bus 3500. Data provided via the user interface 3300 or processed by the CPU 3100 may be stored in the memory system 2000.

In FIG. 17, an example is exemplarily shown where a memory device 2100 is connected with the system bus 3500 via a controller 2200. However, in alternate embodiments, the memory device 2100 can be directly connected to the system bus 3500.

The memory system 2000 in FIG. 17 may correspond to a memory system described in FIG. 16. However, in an alternate embodiment, the memory system 2000 can be replaced with a memory system 1000 described in FIG. 1.

In an exemplary embodiment, the computing system 3000 may be configured to include one or all of memory systems 1000 and 2000 described with reference to FIGS. 1 and 16.

While the inventive concept has been described in connection with exemplary embodiments thereof, it is to be understood that the inventive concept is not limited to the disclosed embodiments, but, on the contrary, is intended to cover various modifications and equivalent arrangements included within the spirit and scope of the disclosure.

What is claimed is:

1. A method of operating a memory controller to control a memory device, the method comprising:
reading data that comprises a data portion and a parity portion from the memory device;
determining a condition of the data portion based on the read data; and
performing a data processing i) only for the data portion if the condition of the data portion is good and the parity portion is not needed, ii) for both the data portion and the parity portion if the condition of the data portion is bad and both the data portion and the parity portion are needed, or iii) only for the data portion if the condition of the data portion is bad and only the data portion is needed.

2. The method of claim 1, wherein power consumption of the memory controller when the data processing is performed only for the data portion is less than power consumption of the memory controller when the data processing is performed for both the data portion and the parity portion.

3. The method of claim 1, wherein an operating cycle of the data processing performed only for the data portion is less than an operating cycle of the data processing performed for both the data portion and the parity portion.

4. The method of claim 1, wherein only the data portion is needed when a number of defects within the data portion is a first value, and both the data portion and the parity portion are needed when the number is a second value higher than the first value.

5. The method of claim 1, wherein the data processing comprises an error search.

6. The method of claim 5, further comprising correcting the data based on the performed error search.

7. The method of claim 5, wherein the error search is a forward chien search.

8. A memory system comprising:
a non-volatile memory NVM; and
a memory controller configured to read data that comprises a data portion and a parity portion from the NVM, determine a condition of the data portion based on the read data, and perform a data processing i) only for the data portion if the condition of the data portion is good and the parity portion is not needed, ii) for both the data portion and the parity portion if the condition of the data portion is bad and both the data portion and the parity portion are needed, or iii) only for the data portion if the condition of the data portion is bad and only the data portion is needed.

9. The memory system of claim 8, wherein power consumption of the memory controller when the data processing is performed only for the data portion is less than power consumption of the memory controller when the data processing is performed for both the data portion and the parity portion.

10. The memory system of claim 8, wherein an operating cycle of the data processing performed only for the data portion is less than an operating cycle of the data processing performed for both the data portion and the parity portion.

11. The memory system of claim 8, wherein only the data portion is needed when a number of defects within the data portion is a first value, and both the data portion and the parity portion are needed when the number is a second value higher than the first value.

12. The memory system of claim 8, wherein the data processing comprises an error search.

13. The memory system of claim 12, wherein the memory controller comprises an error correcting code ECC decoder configured to perform the read and the error search, and correct the read data based on the performed error search.

14. The memory controller of claim 12, wherein the error search is a forward chien search.

15. A computing device comprising a solid state drive SSD, the wherein the SSD comprises:
a first plurality of non-volatile memory NVM chips configured to communicate across a first channel;
a second plurality of NVM chips configured to communicate across a second channel independent of the first channel;
a memory controller configured to read data that comprises a data portion and a parity portion across each channel from a corresponding NVM chip, determine a condition based on the read data, and perform a data processing i) only for the data portion if the condition of the data portion is good and the parity portion is not needed, ii) for both the data portion and the parity portion if the condition of the data portion is bad and both the data portion and the parity portion are needed, or iii) only for the data portion if the condition of the data portion is bad and only the data portion is needed.

16. The computing system of claim 15, wherein power consumption of the memory controller when the data processing is performed only for the data portion is less than power consumption of the memory controller when the data processing is performed for both the data portion and the parity portion.

17. The computing system of claim 15, wherein an operating cycle of the data processing performed only for the data portion is less than an operating cycle of the data processing performed for both the data portion and the parity portion.

18. The computing device of claim 15, wherein only the data portion is needed when a number of defects within the data portion is a first value, and both the data portion and the parity portion are needed when the number is a second value higher than the first value.

19. The computing device of claim 15, wherein the data processing comprises an error search.

20. The computing system of claim 19, wherein the memory controller corrects the data based on the performed error search.

21. The computing device of claim 19, wherein the error search is a forward chien search.

* * * * *